United States Patent
Itou et al.

(10) Patent No.: US 7,419,385 B2
(45) Date of Patent: Sep. 2, 2008

(54) CONNECTOR MOUNTING STRUCTURE AND ELECTRONIC APPARATUS HAVING THE SAME

(75) Inventors: Dai Itou, Nagoya (JP); Hidehiro Mikura, Kariya (JP); Atsushi Ito, Chiryu (JP); Takayoshi Honda, Kariya (JP); Tadashi Tsuruzawa, Chiryu (JP)

(73) Assignee: DENSO COPRPORATION, Kariya (JP)

( * ) Notice: Subject to any disclaimer, the term of this patent is extended or adjusted under 35 U.S.C. 154(b) by 0 days.

(21) Appl. No.: 11/711,147

(22) Filed: Feb. 27, 2007

(65) Prior Publication Data

US 2007/0218715 A1 Sep. 20, 2007

(30) Foreign Application Priority Data

Mar. 1, 2006 (JP) ............... 2006-055383

(51) Int. Cl.
  *H01R 12/00* (2006.01)
(52) U.S. Cl. ................................ 439/76.1
(58) Field of Classification Search ........... 439/79, 439/83, 573, 76.1, 157, 676; 361/752–753, 361/724, 796, 756
  See application file for complete search history.

(56) References Cited

U.S. PATENT DOCUMENTS

| | | | |
|---|---|---|---|
| 5,580,269 A * | 12/1996 | Fan | 439/79 |
| 6,178,094 B1 * | 1/2001 | Hakozaki | 361/796 |
| 6,407,925 B1 | 6/2002 | Kobayashi et al. | |
| 6,707,678 B2 | 3/2004 | Kobayashi et al. | |
| 6,866,524 B2 | 3/2005 | Takata | |
| 6,898,852 B2 * | 5/2005 | Abazarnia et al. | 29/857 |
| 6,955,551 B2 * | 10/2005 | Yamamoto | 439/181 |
| 7,140,885 B2 * | 11/2006 | Kitamura | 439/76.1 |

FOREIGN PATENT DOCUMENTS

JP  A-2005-184929  7/2005

* cited by examiner

*Primary Examiner*—Edwin A León
(74) *Attorney, Agent, or Firm*—Posz Law Group, PLC (57) ABSTRACT

A connector mounting structure includes a circuit board, a surface mount connector mounted to the circuit board, and an electronic component. The connector includes a connector body and a plurality of conductive terminals. The connector body has a base portion placed on a front surface of the circuit board and a tube portion. The terminals are disposed in the base portion of the connector body. The tube portion has a first opening portion for partially receiving the circuit board and a second opening portion for communicating with an external device. The electronic component is mounted to a back surface of the circuit board. A space for the electronic component is provided approximately beneath the base portion, between the back surface of the circuit board and the first opening portion of the tube portion.

20 Claims, 6 Drawing Sheets

CONNECTOR MOUNTING STRUCTURE AND ELECTRONIC APPARATUS HAVING THE SAME

CROSS REFERENCE TO RELATED APPLICATION

This application is based on and incorporates herein by reference Japanese Patent Application No. 2006-55383 filed on Mar. 1, 2006.

FIELD OF THE INVENTION

The present invention relates to a connector mounting structure and an electronic apparatus having the mounting structure.

BACKGROUND OF THE INVENTION

In a conventional through-hole mounting structure disclosed in, for example, U.S. Pat. No. 6,707,678 corresponding to JP-3669224, each terminal of a connector is inserted into a through hole formed in a circuit board. A conductive land is formed on an inner wall of the hole and formed on a front surface of the board around an opening of the hole. The terminal of the connector is soldered to the land in a reflow process so that the connector is electrically and mechanically connected to the circuit board. Thus, the connector is mounted to the front surface of the board. Since the terminal of the connector is exposed to a back surface of the board, other components cannot be mounted to the back surface of the board, directly beneath the through hole. Therefore, the through-hole mounting structure limits circuit density of the circuit board.

In a surface mounting structure disclosed in, for example, U.S. Pat. No. 6,866,524 corresponding to JP-2004-206924A, each terminal of a connector is bent along a surface of a circuit board and soldered to a land formed on the surface of the circuit board. The surface mounting structure allows electronic components to be mounted on each side of the circuit board so that high circuit density of the circuit board can be achieved.

In such a mounting structure, the terminal of the connector is soldered to the land formed on the circuit board. To reduce the size of the circuit board, i.e., to improve circuit density of the circuit board, contact area between the terminal and the land is reduced. Therefore, the terminal of the connector must be accurately positioned relative to the land formed on the circuit board in order to ensure connection reliability between the connector and the circuit board.

In the surface mounting structure disclosed in U.S. Pat. No. 6,866,524, the terminal is disposed in a body of the connector and extends from the connector body to the surface of the circuit board. Since the connector body is placed on the circuit board, the length of the terminal is relatively long. Therefore, displacement of the terminal relative to the connector body causes large displacement of the terminal relative to the land formed on the circuit board. It is difficult to ensure the connection reliability between the connector and the circuit board.

SUMMARY OF THE INVENTION

In view of the above-described problem, it is an object of the present invention to provide a connector mounting structure for achieving improved connection reliability and circuit density.

A connector mounting structure includes a circuit board, a surface mount connector surface-mounted to the circuit board, and an electronic component. The connector includes a connector body and a plurality of conductive terminals. The connector body has a base portion placed on a front surface of the circuit board and a tube portion. The terminals are disposed in the base portion of the connector body. Each of the terminals has a first end exposed to a first surface of the base portion and is connected to a conductive land formed on the front surface of the circuit board and has a second end exposed to a second surface of the base portion to be connectable to an external device. The tube portion has a first opening portion for partially receiving the circuit board and a second opening portion for communicating with the external device. The electronic component is mounted to a back surface of the circuit board. A space for the electronic component is provided approximately beneath the base portion, between the back surface of the circuit board and the first opening portion of the tube portion of the connector body. The circuit board is partially received in the tube portion of the connector body. Therefore, the length of the first end of the terminal can be reduced so that it is unlikely that displacement of the first end relative to the land occurs. Thus, connection reliability between the connector and the circuit board can be improved. The space for the electronic component is provided approximately beneath the base portion, between the back surface of the circuit board and the first opening portion of the tube portion. Therefore, circuit density of the circuit board can be improved so that size of the circuit board can be reduced.

Another object of the present invention is to provide an electronic apparatus having the connector mounting structure.

BRIEF DESCRIPTION OF THE DRAWINGS

The above and other objectives, features and advantages of the present invention will become more apparent from the following detailed description made with reference to the accompanying drawings. In the drawings.

DETAILED DESCRIPTION OF THE PREFERRED EMBODIMENTS

First Embodiment

Figure 1:
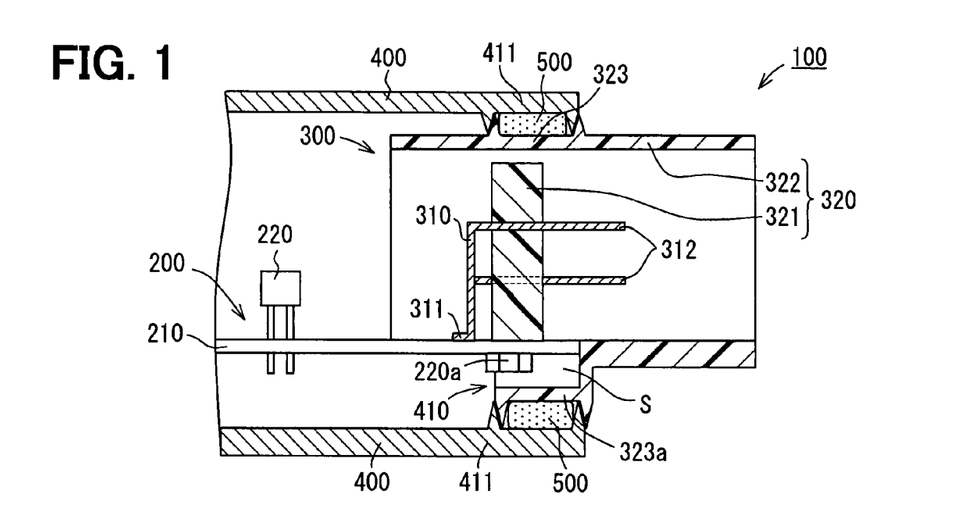
FIG. 1 is a cross sectional view of an electronic apparatus having a connector mounting structure according to a first embodiment of the present invention.

As shown in FIG. 1, an electronic apparatus 100 includes a circuit board 200, a surface mount connector 300 mounted to the circuit board 200, and a housing 400 for holding the circuit board 200 therein. The housing 400 is sealed by a sealant 500 so that the circuit board 200 held in the housing 400 is protected from water. Thus, the electronic apparatus 100 is waterproof and is suitable for use in an electronic control unit (ECU) installed in an engine room of a vehicle, for example.

The circuit board 200 includes a printed board 210 and an electronic element 220 mounted to the printed board 210. The printed board 210 has wiring patterns and via holes connecting the wiring patterns. The printed board 210 may be, for example, made of thermoplastic resin, thermoset resin, ceramic, glass-resin composite (e.g., glass cloth), or the like. In the first embodiment, the printed board 210 is a multilayer board including multiple inner layers, each of which includes a wiring pattern and made of epoxy resin containing glass cloth. The electronic element 220 may be, for example, a microcomputer, a resistor, a capacitor, or the like.

The connector 300 includes multiple terminals 310 made of a conductive material and a connector body 320 made of an insulating material (e.g., synthetic resin). The circuit board 200 is connected to an external device (not shown) via the connector 300. The connector body 320 has a base portion 321 mounted on the printed board 210 and a tube portion 322 fixed to the housing 400. The terminals 310 are disposed in the base portion 321 and at least a portion of the terminals 310 is positioned inside the tube portion 322. The tube portion 322 is used for connection to a female connector of the external device.

Each terminal 310 has a first end 311 and a second end 312. The first end 311 is exposed to a first surface of the base portion 321 and connected to the circuit board 200. The second end 312 is exposed to a second surface of the base portion 321 and positioned inside the tube portion 322 to be connected to the female connector of the external device.

The base portion 321 and the tube portion 322 are separated from each other. As shown FIG. 2A, the terminals 310 are disposed in the base portion 321 at different heights from the printed board 210. The first end 311 is soldered to a corresponding land formed on a first surface (a top surface) of the printed board 210. A portion of the circuit board 200, a portion of the base portion 321, and the second end 312 are positioned inside the tube portion 322 of the connector body 320. A surface mount electronic component 220a is mounted to a back surface (a bottom surface) of the printed board 210, approximately beneath the base portion 321.

Figure 2A:
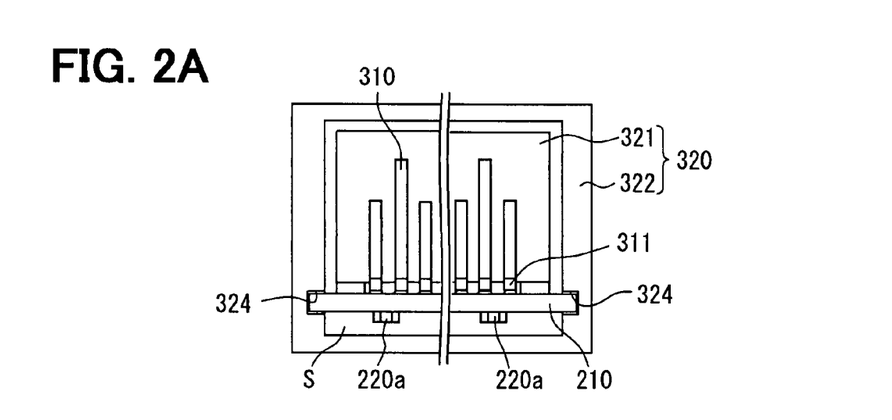
FIG. 2A is a rear side view of the connector mounting structure of FIG. 1.
Figure 2B:
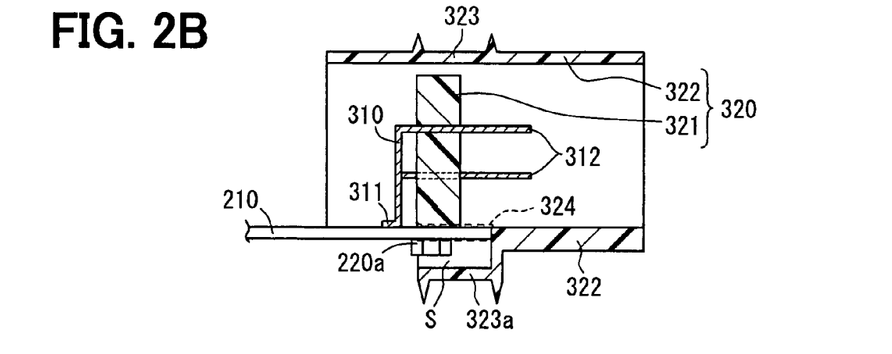
FIG. 2B is a cross sectional view of the connector mounting structure of FIG. 2A.

The tube portion 322 has a first opening communicating with the inside of the housing 400 and a second opening communicating with the outside of the housing 400. The tube portion 322 has an expanded portion 323a on the side of the first opening so that the first opening is larger than the second opening. In the condition that the circuit board 200 is partially held in the second opening of tube portion 322, the expanded portion 323a is positioned approximately beneath the base portion 321. Thus, a space S is provided approximately beneath the base portion 321, between the back surface of the printed board 210 and the expanded portion 323a of the tube portion 322. At least one electronic component 220a is mounted to the back surface of the printed board 210 in the space S. In such an approach, wiring length between the terminal 310 and the electronic component 220a can be reduced so that wiring impedance can be reduced.

The inner wall of the tube portion 322 is partially recessed to provide guide portions 324 for guiding the circuit board 200 to a predetermined position. The circuit board 200 can be accurately positioned relative to the tube portion 322 by inserting side portions of the printed board 210 in the guide portions 324. Each guide portion 324 has uniform width equal to or slightly larger than a thickness of the printed board 210 and extends along the expanded portion 323a.

As described above, the base portion 321 and the tube portion 322 of the connector body 320 are separated from each other. The base portion 321 is mounted on the circuit board 200 and the first end 311 of the terminal 310 is soldered to the circuit board 200 in a reflow process. Then, the circuit board 200, on which the base portion 321 is mounted, is accurately positioned relative to the tube portion 322 by using the guide portion 324. Thus, the base portion 321 and the tube portion 322 are assembled, after the base portion 321 is mounted on the circuit board 200 and the terminal 310 is soldered to the circuit board 200. Therefore, the terminal 310 can be easily and accurately soldered to the circuit board 200 so that connection reliability between the circuit board 200 and the connector 300 can be improved.

The housing 400 is made of metal (e.g., aluminum, or iron), or resin (e.g., synthetic resin). The housing 400 is opened at one end and closed at the other end. The tube portion 322 of the connector body 320 is fitted in an opened end 410 of the housing 400. Thus, the circuit board 200 inside the housing 400 can be electrically connected to the external device outside the housing 400 via the connector 300. The circuit board 200 is fixed to the housing 400 by a screw, for example.

The tube portion 322 has a first engagement portion 323, and the housing 400 has a second engagement portion 411. The tube portion 322 is fitted into the opened end 410 of the housing 400 by engaging the first engagement portion 323 with the second engagement portion 411. The expanded portion 323a acts as the first engagement portion 323. The sealant 500 is placed between the first and second engagement portions 323, 411 to fill gap between the tube portion 322 and the housing 400. Thus, the housing 400 is fully sealed when the connector 300 is connected to the female connector of the external device.

The sealant 500 is a material having elasticity and adhesion. For example, the sealant 500 is moisture curing silicone adhesive having hardness of between 150 Pa·s and 200 Pa·s before the adhesive cures. Alternatively, the sealant 500 may be a material disclosed in JP-2005-93602 related to the invention of the present applicants.

Figure 3A:
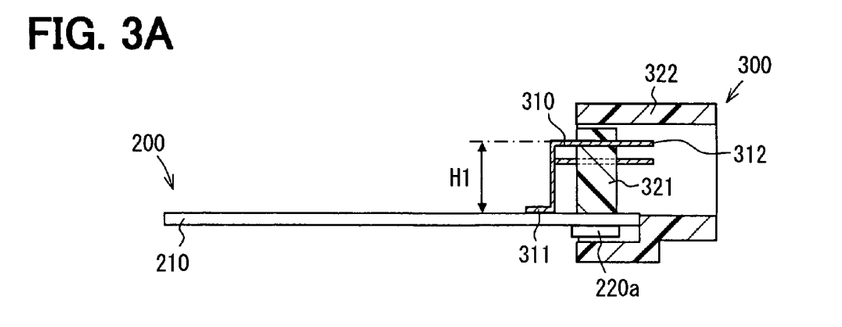
FIG. 3A is a cross sectional view of the connector mounting structure of FIG. 1.

According to the first embodiment shown in FIG. 3A, the circuit board 200 is partially positioned inside the connector body 320 in the condition that the connector 300 is mounted to the circuit board 200. The maximum length of the terminal 310 from the front surface of the printed board 210 is H1.

Figure 3B:
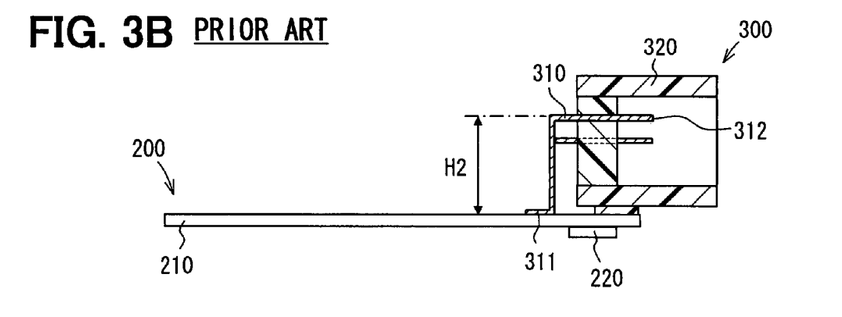
FIG. 3B is a cross sectional view of a conventional connector mounting structure.

In contrast, according to the prior art shown in FIG. 3B, the circuit board 200 is partially positioned outside the connector body 320 in the condition that the connector 300 is mounted to the circuit board 200. Specifically, the circuit board 200 is partially placed on the connector body 320. The maximum length of the terminal 310 measured from the front surface of the printed board 210 is H2.

As can be seen from comparing FIGS. 3A and 3B, the length H1 in the first embodiment is less than the length H2 in the prior art. In the first embodiment, therefore, it is unlikely that displacement of the terminal 310 relative to the connector body 320 causes large displacement of the first end 311 of the terminal 310 relative to a conductive land formed on the printed board 210. Thus, the connection reliability between the connector 300 and the circuit board 200 can be improved compared to the prior art.

According to the first embodiment, the space S is provided between the back surface of the circuit board 200 and the connector body 320. The electronic component 220a is mounted to the back surface of the circuit board 200 in the space S. In such an approach, circuit density of the circuit board 200 can be improved so that the size of the circuit board 200 can be reduced.

According to the first embodiment, the tube portion 322 of the connector body 320 is fitted into the opened end 410 of the housing 400 by engaging the first engagement portion 323 with the second engagement portion 411. The sealant 500 is placed between the first and second engagement portions 323, 411 to fill gap between the tube portion 322 and the housing 400. Thus, the housing 400 is fully sealed when the connector 300 is connected to the female connector of the external device.

In contrast, according to the prior, since the connector body 320 is placed on the circuit board 200, it is difficult to fully seal between the connector body 320 and the housing 400. If the connector body 320 and the housing 400 are sealed to each other across the circuit board 200, the electronic component 220a cannot be mounted to the back surface of the printed board 210. In the prior art, therefore, only one of waterproofness and improvement of the circuit density can be achieved.

Figure 4:
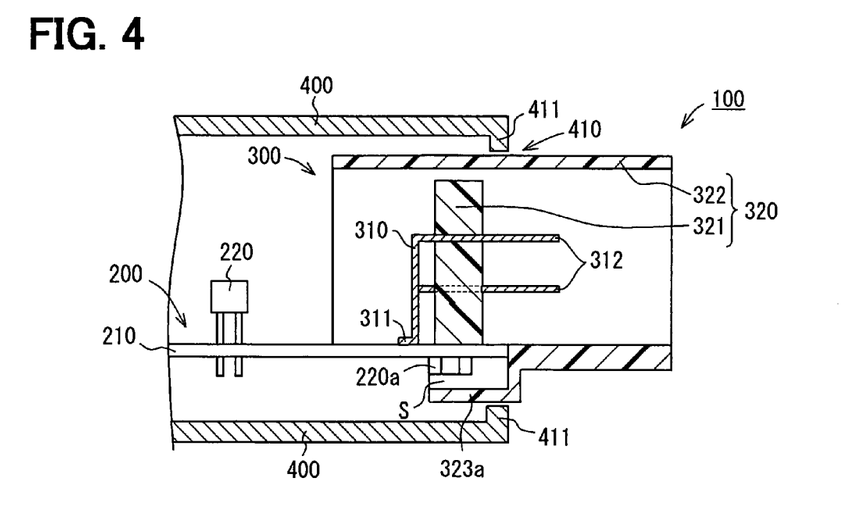
FIG. 4 is a cross sectional view of a connector mounting structure according to a modification of the first embodiment.

As described above, according to the first embodiment, the electronic apparatus 100 is waterproof. Alternatively, the electronic apparatus 100 may not be waterproof, as shown in FIG. 4. The housing 400 is positioned relative to the tube portion 322 such that the second engagement portion 411 of the housing 400 faces the expanded portion 323a of the tube portion 322. In the electronic apparatus 100 shown in FIG. 4, although the electronic apparatus 100 is not waterproof, the connection reliability and the circuit density can be improved.

Figure 5:
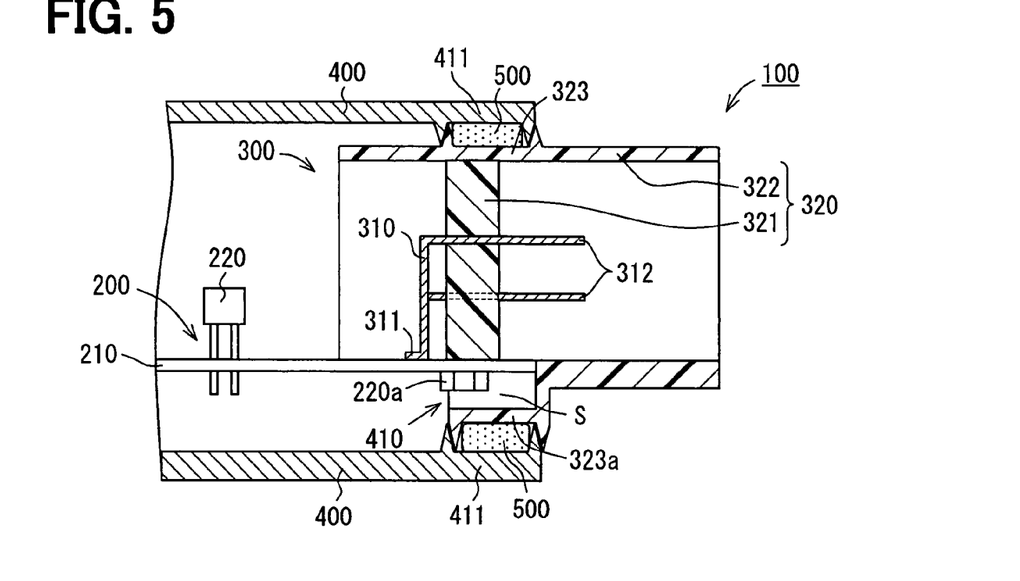
FIG. 5 is a cross sectional view of a connector mounting structure according to a modification of the first embodiment.

According to the first embodiment, the base portion 321 and the tube portion 322 of the connector body 320 are separated from each other. Alternatively, the base portion 321 and the tube portion 322 of the connector body 320 may be integrally formed with each other, as shown in FIG. 5. In the case of FIG. 5, the reflow process is performed under the condition that the circuit board 200 is received in the tube portion 322. Therefore, it is preferable that the first end 311 is exposed to the first surface of the base portion 321 and the second end 312 is exposed to the second surface of the base portion 321. In short, it is preferable that the first end 311 and the second end 312 are disposed on opposite sides of the base portion 321.

Figure 6A:
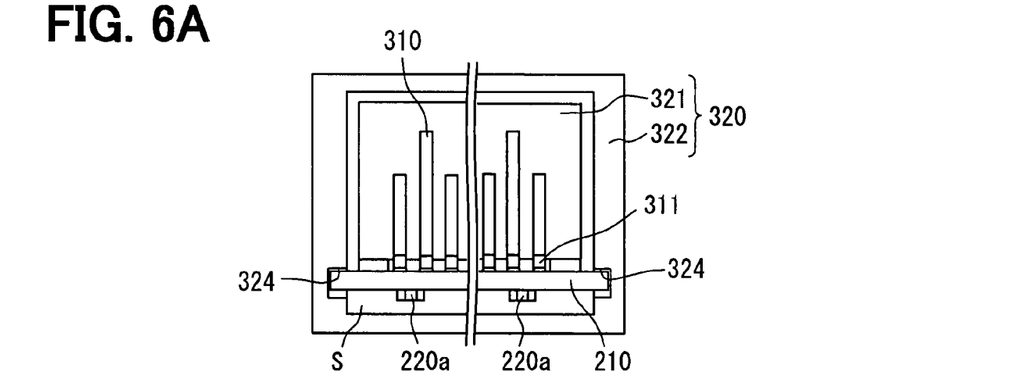
FIG. 6A is a rear side view of a connector mounting structure according to a modification of the first embodiment.
Figure 6B:
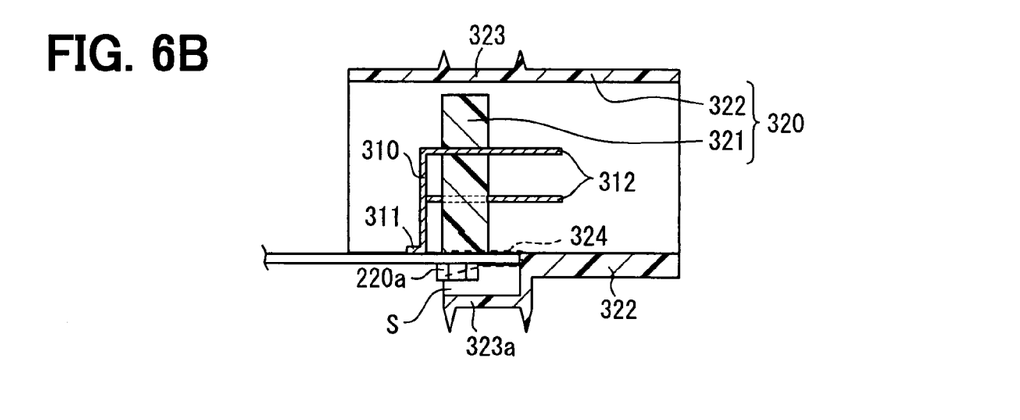
FIG. 6B is a cross sectional view of the connector mounting structure of FIG. 6A.

According to the first embodiment, the tube portion 322 has the guide portions 324 for guiding the circuit board 200 in the predetermined position. Each guide portion 324 has the uniform width equal to or slightly larger than the thickness of the printed board 210 and extends along the expanded portion 323a. Alternatively, as shown in FIGS. 6A and 6B, each guide portion 324 has nonuniform width. Specifically, the guide portion 324 has larger width on the side of the first opening of the tube portion 322 than on the side of the second opening of the tube portion 322. In such an approach, the printed board 210 can be easily inserted in the guide portions 324 so that the circuit board 200 can be easily and accurately positioned relative to the tube portion 322.

Figure 7:
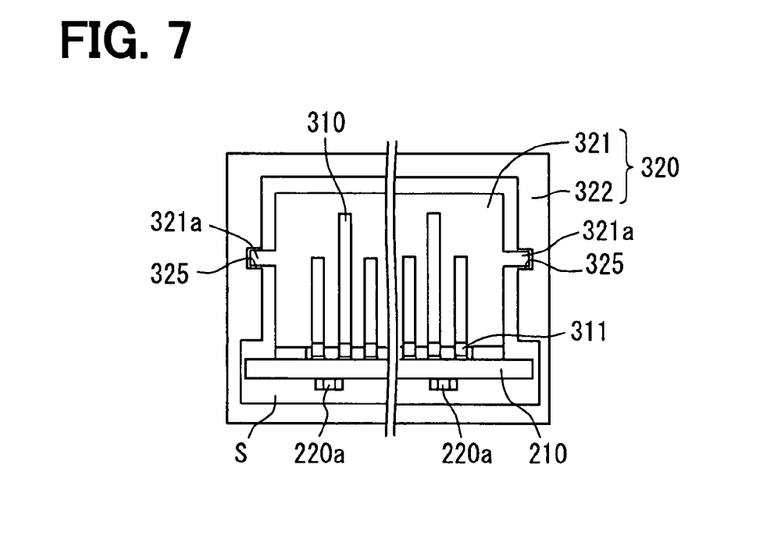
FIG. 7 is a rear side view of a connector mounting structure according to a modification of the first embodiment.

According to the first embodiment, the circuit board 200 is accurately positioned relative to the tube portion 322 by inserting the printed board 210 in the guide portions 324. Alternatively, the base portion 321 may have projection portions 321a and the tube portion 322 has guide portions 325. The circuit board 200 is accurately positioned relative to the tube portion 322 by inserting the projection portions 321a of the base portion 321 in the guide portions 325 of the tube portion 322.

According to the first embodiment, the electronic component 220a is of a surface mount type. Alternatively, the electronic component 220a may be of a through hole mount type.

According to the first embodiment, the first end 311 and the second end 312 are disposed on the opposite sides of the base portion 321. Alternatively, the first end 311 and the second end 312 may be disposed on the same side of the base portion 321.

In the prior art shown in FIG. 3B, if the first end 311 and the second end 312 are disposed on the same side, the whole connector body 320 must be placed on the circuit board 200 to allow the first end 311 to be soldered to the circuit board 200. Therefore, the circuit density of the circuit board 200 is reduced. Further, it is difficult to seal between the connector body 320 and the housing 400.

In contrast, in the first embodiment shown in FIG. 3A, the circuit board 200 is partially positioned inside the connector body 320 in the condition that the connector 300 is mounted to the circuit board 200. Thus, even if the first end 311 and the second end 312 are disposed on the same side, the first end 311 can be soldered to the circuit board 200 without reducing the circuit density of the circuit board 200. Further, the sealant 500 placed between the first and second engagement portions 323, 411 fully seals between the connector body 320 and the housing 400.

Second Embodiment

Figure 8:
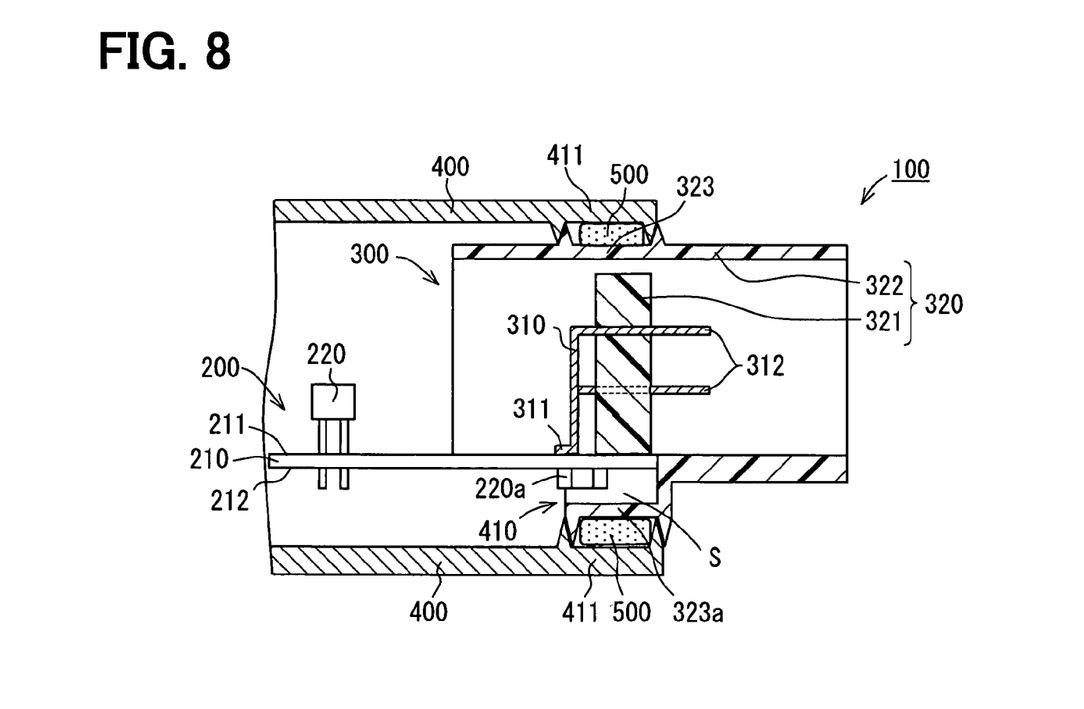
FIG. 8 is a cross sectional view of a connector mounting structure according to a second embodiment of the present invention.
Figure 9A:
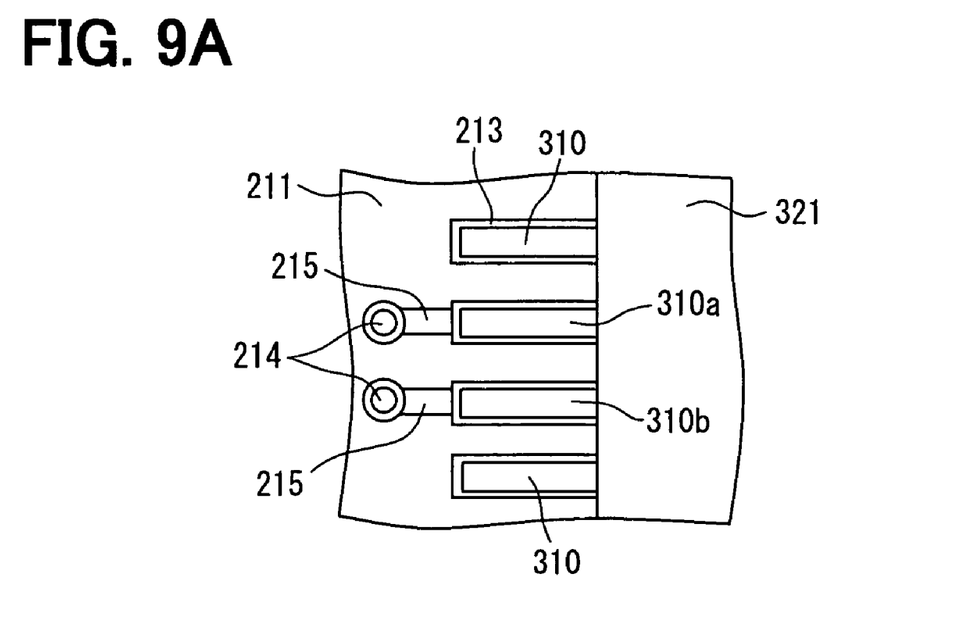
FIG. 9A is a plan view of a front surface of a printed board of FIG. 8.
Figure 9B:
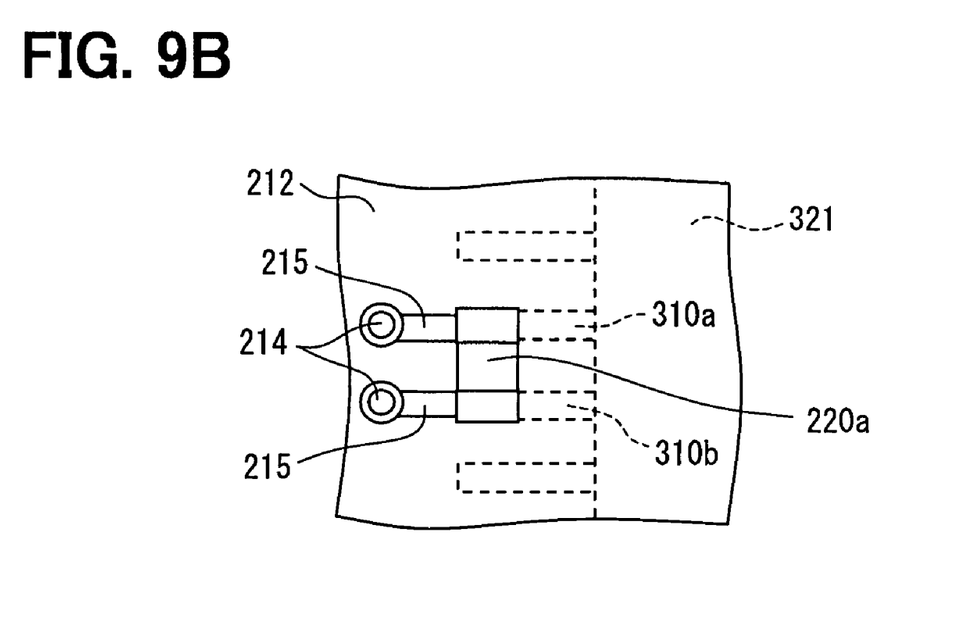
FIG. 9B is a plan view of a back surface of the printed board of FIG. 8.

The second embodiment of the present invention is shown in FIG. 8 and FIG. 9A, 9B. In the first embodiment described previously, as shown in FIG. 1, the electronic component 220a is mounted to the back surface of the printed board 210, approximately beneath the base portion 321. In contrast, in the second embodiment, as shown in FIG. 8, the electronic component 220a is mounted to a back surface 212 of the printed board 210, approximately beneath a conductive land 213 to which the terminal 310 is soldered. The terminal 310 and the electronic component 220a are connected to each other by a via hole 214 and a wiring member 215. Since the electronic component 220a is mounted approximately beneath the land 213, the length of the wiring member 215 can be greatly reduced so that the wiring impedance can be greatly reduced.

Further, as shown in FIGS. 9A and 9B, a power terminal 310a and a ground terminal 310b of the terminals 310 are arranged adjacent to each other in a direction along the surface of the printed board 210. In such an approach, the length of the wiring member 215 can be more greatly reduced so that the wiring impedance can be more greatly reduced. Thus, electromagnetic compatibility (EMC) can be satisfied.

The electronic component 220a may be a noise reduction capacitor for eliminating noise transmitted from the external device to the circuit board 200 via the terminal 310 of the connector 300. Since the electronic component 220a is mounted approximately beneath the land 213 soldered to the terminal 310, the noise can be efficiently eliminated by the electronic component 220a. Alternatively, the electronic component 220a may be a resistor for eliminating static electricity transmitted from the external device to the circuit board 200 via the connector 300. Alternatively, the electronic component 220a may be a voltage stabilizing capacitor for stabilizing a power voltage supplied via the connector 300. Alternatively, the electronic component 220a may be a resistor for eliminating static electricity transmitted from the external device to the circuit board 200 via the connector 300.

Third Embodiment

Figure 10:
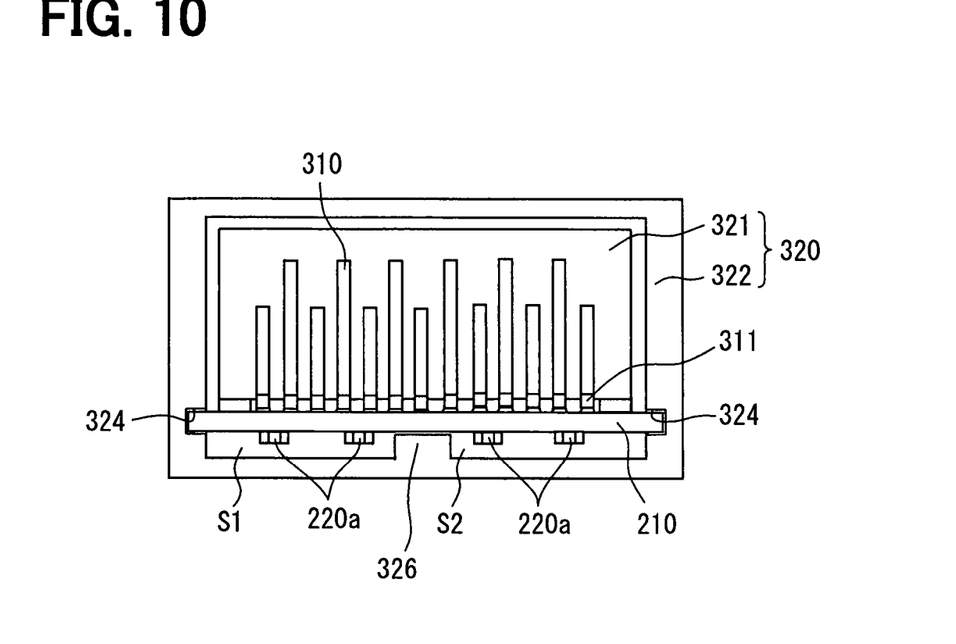
FIG. 10 is a rear side view of a connector mounting structure according to a third embodiment of the present invention.
Figure 11:
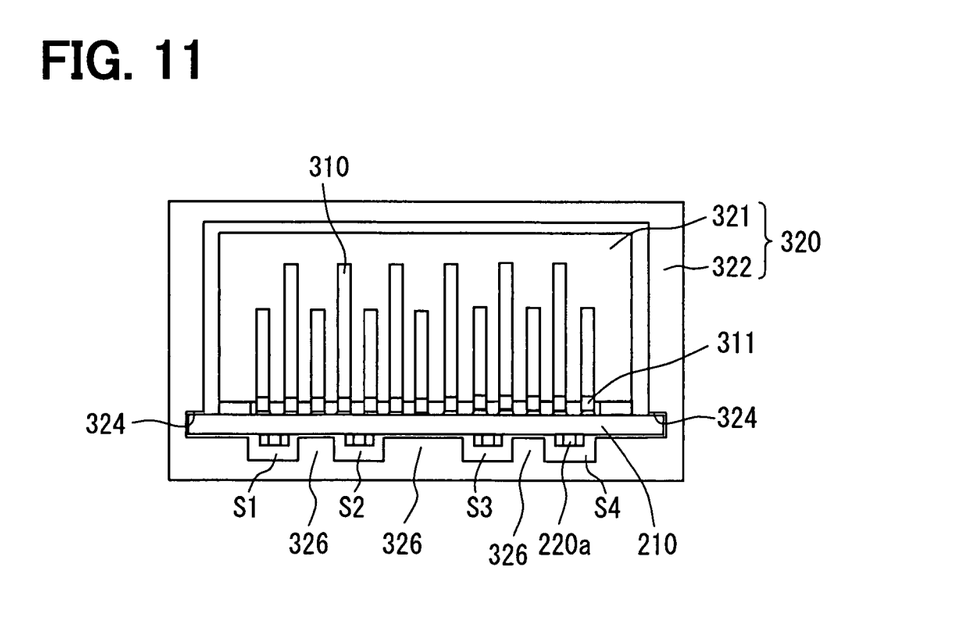
FIG. 11 is a rear side view of a connector mounting structure according to a modification of the third embodiment.

The third embodiment of the present invention is shown in FIG. 10. The tube portion 322 has an extension portion 326 extending from the inner surface of the tube portion 322 toward the back surface of the circuit board 200. Thus, the space S is divided into spaces S1, S2 by the extension portion 326. At least one electronic component 220a is arranged in each of the spaces S1, S2. The extension portion 326 supports the circuit board 200 to increase stiffness of the connector 300. Alternatively, the tube portion 322 has three extension portions 326 extending from the inner surface of the tube portion 322 toward the back surface of the circuit board 200. Thus, the space S is divided into spaces S1, S2, S3, S4 by the extension portions 326. At least one electronic component 220a is arranged in each of the spaces S1, S2, S3, S4. In such an approach, the stiffness of the connector 300 can be more increased. As the size of each space is small, the stiffness of the connector 300 is increased. Therefore, it is preferable that each space is as small as possible. The number of the extension portions 326 is variable. Alternatively, the tube portion 322 has a recessed portion instead of the extension portion 326 to divide the space S.

MODIFICATIONS

The embodiments described above may be modified in various ways. For example, the first embodiment and the second embodiment can be combined. The length and shape of the tube portion 322 can vary. The base portion 321 may be mounted on the printed board 210 outside the tube portion 322.

Such changes and modifications are to be understood as being within the scope of the present invention as defined by the appended claims.

What is claimed is:

1. A connector mounting structure comprising:
a circuit board, wherein the circuit has a top surface and a bottom surface, which are parallel and opposite to one another;
a surface mount connector mounted to the top surface of the circuit-board, the connector including a connector body and a plurality of conductive terminals each of which has a first end connected to the top surface of the circuit board and a second end connectable to an external device, the connector body having a base portion placed on the top surface of the circuit board and a tube portion, the plurality of conductive terminals disposed in the base portion, the tube portion having a first opening portion for receiving a part of the circuit board and a second opening portion for communicating with the external device; and
at least one electronic component mounted to the bottom surface of the circuit board, wherein a space for the electronic component is provided beneath the circuit board between the bottom surface of the circuit board and a wall that defines the first opening portion of the tube portion beneath the circuit board.

2. The mounting structure according to claim 1, wherein the first end of each of the plurality of conductive terminals is exposed to a first surface of the base portion of the connector body, and
the second end of each of the plurality of conductive terminals is exposed to a second surface of the base portion of the connector body.

3. The mounting structure according to claim 1, wherein
the tube portion includes a projection portion extending from an inner wall of the tube portion to the back surface of the circuit board to divide the space into a plurality of spaces,
the at least one electronic component includes a plurality of electronic components, and
at least one of the plurality of electronic components is received in a corresponding one of the spaces.

4. The connector mounting structure according to claim 1, wherein the electronic component is located between the base portion and the wall.

5. The mounting structure according to claim 1, wherein the electronic component is surface-mounted to the bottom surface of the circuit board, beneath the first end of at least one of the plurality of conductive terminals or the base portion of the connector body.

6. The mounting structure according to claim 5, wherein the electronic component is surface-mounted to the bottom surface of the circuit board, beneath the first end of at least one of the plurality of conductive terminals.

7. The mounting structure according to claim 6, wherein
the plurality of conductive terminals includes power and ground terminals arranged adjacent to each other in a direction along the circuit board, and
the electronic component is surface-mounted to the bottom surface of the circuit board, beneath the first end of each of the power and ground terminals.

8. The mounting structure according to claim 6, wherein the electronic component is a noise reduction capacitor for eliminating noise transmitted from the external device to the circuit board via the connector.

9. The mounting structure according to claim 6, wherein the electronic component is a voltage stabilizing capacitor for stabilizing a power voltage supplied via the connector.

10. The mounting structure according to claim 6, wherein the electronic component is a noise reduction capacitor for eliminating noise transmitted from the circuit board to the external device via the connector.

11. The mounting structure according to claim 6, wherein the electronic component is a resistor for eliminating static electricity transmitted from the external device to the circuit board via the connector.

12. The mounting structure according to claim 1, wherein the base portion and the tube portion are separated from each other.

13. The mounting structure according to claim 12, wherein
the tube portion of the connector body includes guiding slots provided with the first opening portion, and
edges of the circuit board are each received in one of the guiding slots so that the circuit board is accurately positioned relative to the tube portion.

14. The mounting structure according to claim 13, wherein a width of the guiding slots decreases in a direction from the first opening portion to the second opening portion.

15. The mounting structure according to claim 1, wherein:
the mounting structure is held in a housing having an opening; and the second opening portion of the tube portion of the connector body of the connector is exposed outside the housing through the opening of the housing.

16. The electronic apparatus according to claim 15, wherein
the first opening portion of the tube portion has a first engagement portion,
the opening of the housing has a second engagement portion, and the first engagement portion overlaps the second engagement portion so that the tube portion communicates with the housing.

17. The electronic apparatus according to claim 16, further comprising: a sealing member disposed between the first engagement portion and the second engagement portion to seal between the tube portion end the housing.

18. A connector mounting structure comprising:
a circuit board, wherein the circuit board has a top surface and a bottom surface, and the top surface and the bottom surface are parallel and opposite to one another;
a connector including:
a plurality of conductive terminals;
a base that is mounted to the top surface of the circuit board, wherein the base holds the plurality of conductive terminals; and
a body that accommodates the base and has a shape adapted to be coupled with a mating connector, wherein the body includes a tube portion that defines hollow space for accommodating the base, a guide portion that includes guiding slots for receiving opposing edges of a part of the circuit board, and a bottom wall that is spaced apart from and opposed to the bottom surface of the circuit board to define a space between the circuit board and the bottom wall, and
at least one electronic component that is mounted to the bottom surface of the circuit board in the space such that the electronic component is beneath the part of the circuit board that is received in the guiding slots and is opposed to the bottom wall.

19. The connector mounting structure according to claim 18 wherein the base is mounted to the top surface of a portion of the circuit board that is received between the guiding slots.

20. The connector mounting structure according to claim 18, wherein a width dimension of each of the guiding slots is greater than a thickness dimension of the portion of the circuit board that is received by the guiding slots.

* * * * *